US009660076B2

(12) United States Patent
Iinuma et al.

(10) Patent No.: US 9,660,076 B2
(45) Date of Patent: May 23, 2017

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Toshihiko Iinuma, Yokkaichi (JP); Yasunori Oshima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/944,683

(22) Filed: Nov. 18, 2015

(65) Prior Publication Data
US 2017/0069754 A1 Mar. 9, 2017

Related U.S. Application Data

(60) Provisional application No. 62/214,050, filed on Sep. 3, 2015.

(51) Int. Cl.
| H01L 27/115 | (2017.01) |
| H01L 29/78 | (2006.01) |
| H01L 21/02 | (2006.01) |
| H01L 27/11582 | (2017.01) |

(52) U.S. Cl.
CPC ...... H01L 29/7843 (2013.01); H01L 21/0217 (2013.01); H01L 21/02274 (2013.01); H01L 27/11582 (2013.01)

(58) Field of Classification Search
CPC .......... H01L 27/11582; H01L 29/7842; H01L 29/7843; H01L 21/0217; H01L 21/02274
See application file for complete search history.

(56) References Cited

U.S. PATENT DOCUMENTS

| 8,183,622 | B2 | 5/2012 | Okanishi et al. |
| 9,230,987 | B2* | 1/2016 | Pachamuthu ..... H01L 27/11582 |
| 2012/0208347 | A1* | 8/2012 | Hwang ............... H01L 27/1157 438/430 |
| 2016/0049421 | A1* | 2/2016 | Zhang ............... H01L 27/11582 257/314 |
| 2016/0141294 | A1* | 5/2016 | Peri ..................... H01L 27/1157 257/324 |
| 2016/0141419 | A1* | 5/2016 | Baenninger ....... H01L 27/11524 257/314 |

FOREIGN PATENT DOCUMENTS

JP 8-264531 10/1996

* cited by examiner

*Primary Examiner* — Allison P Bernstein
(74) *Attorney, Agent, or Firm* — Oblon, McClelland, Maier & Neustadt, L.L.P.

(57) ABSTRACT

A semiconductor memory device according to an embodiment includes a substrate, a plurality of conductive members containing a metal and provided on the substrate, a stacked body provided in each region between the conductive members, a semiconductor pillar piercing the stacked body, a memory film and internal stress films. The plurality of conductive members extend in a first direction and are separated from each other in a second direction. The internal stress films also extend in the first direction and are separated from each other in the second direction. The first direction and the second direction are parallel to an upper surface of the substrate and intersect each other. The internal stress films contain material having internal stress having the reverse polarity of internal stress of the metal.

14 Claims, 15 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/214,050, filed on Sep. 3, 2015; the entire contents of which are incorporated herein by reference.

FIELD

Embodiments described herein relate generally to a semiconductor memory device and a method for manufacturing the same.

BACKGROUND

In recent years, a stacked memory device has been proposed in which many electrode layers and the like are stacked on a substrate and memory cells are arranged three-dimensionally to realize higher integration of memory devices such as flash memory, etc. However, in the case where the number of stacks of the electrode layers and the like in the stacked memory device increase, the sum total of the internal stress of the electrode layers and the like becomes large; and the substrate may undesirably warp nonuniformly. There is a possibility that undesirable warping of the substrate may cause problems in the manufacturing processes.

DETAILED DESCRIPTION

A semiconductor memory device according to an embodiment includes a substrate, a plurality of conductive members containing a metal and provided on the substrate, a stacked body provided in each region between the conductive members, a semiconductor pillar piercing the stacked body, a memory film and internal stress films. The plurality of conductive members extend in a first direction and are separated from each other in a second direction. The first direction and the second direction are parallel to an upper surface of the substrate and intersect each other. A plurality of insulating films and a plurality of electrode films are stacked in the stacked body along a third direction intersecting the upper surface of the substrate. The semiconductor pillar extends in the third direction. The memory film is provided between the semiconductor pillar and the electrode films. The internal stress films extend in the first direction and are separated from each other in the second direction. The internal stress films contain material having internal stress having the reverse polarity of internal stress of the metal.

Embodiments of the invention will now be described with reference to the drawings. All of the drawings illustrated hereinbelow are schematic. For example, for easier viewing of the drawings, some of the components are omitted or reduced numbers of components are illustrated in some of the drawings. Also, the numbers and dimensional ratios of the components do not always match between the drawings.

(First Embodiment)

First, a first embodiment will be described.

Figure 1:
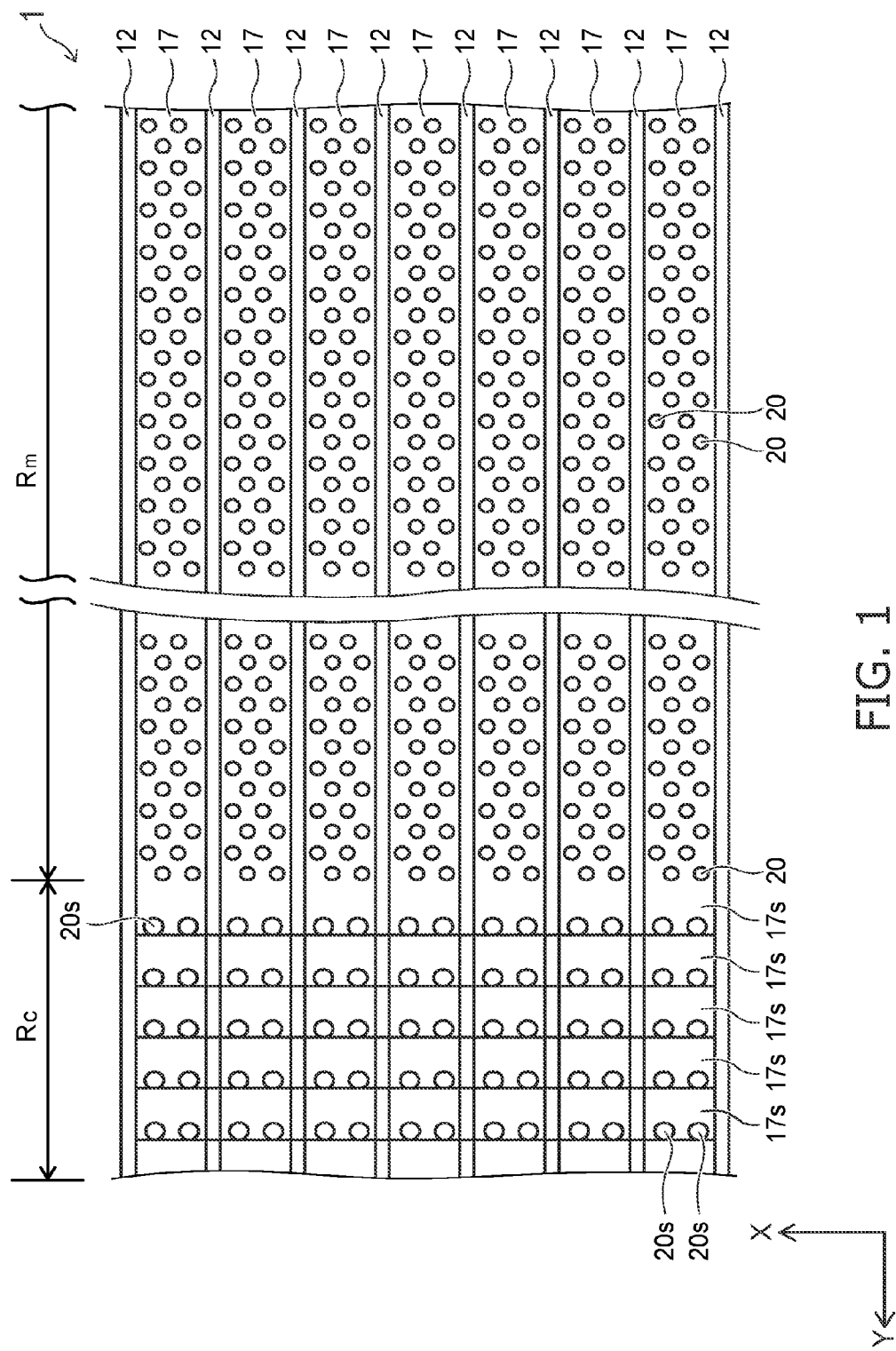
FIG. 1 and FIG. 2 are plan views showing a semiconductor memory device according to a first embodiment.
Figure 2:
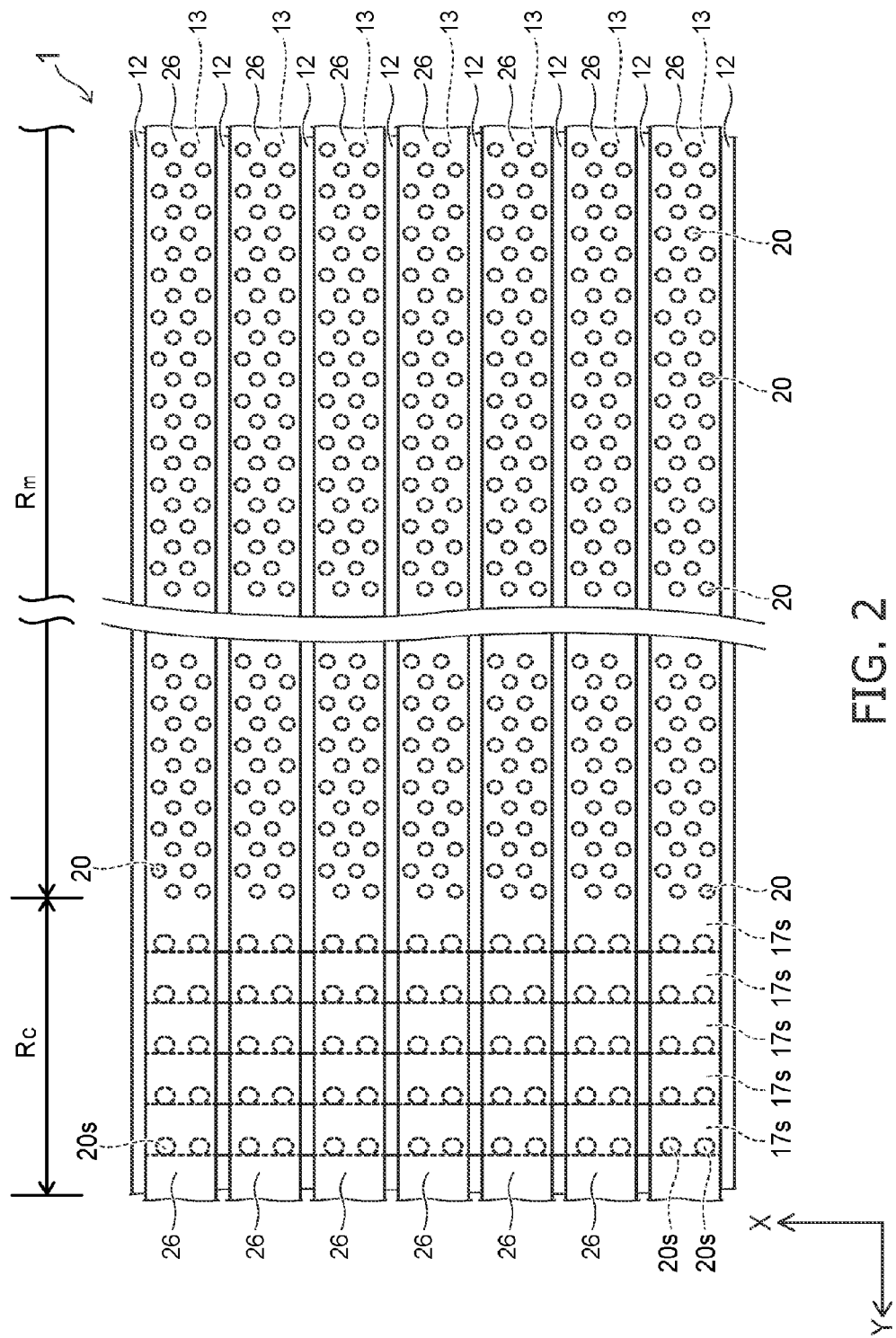

FIG. 1 and FIG. 2 are plan views showing a semiconductor memory device according to the embodiment.

Figure 3:
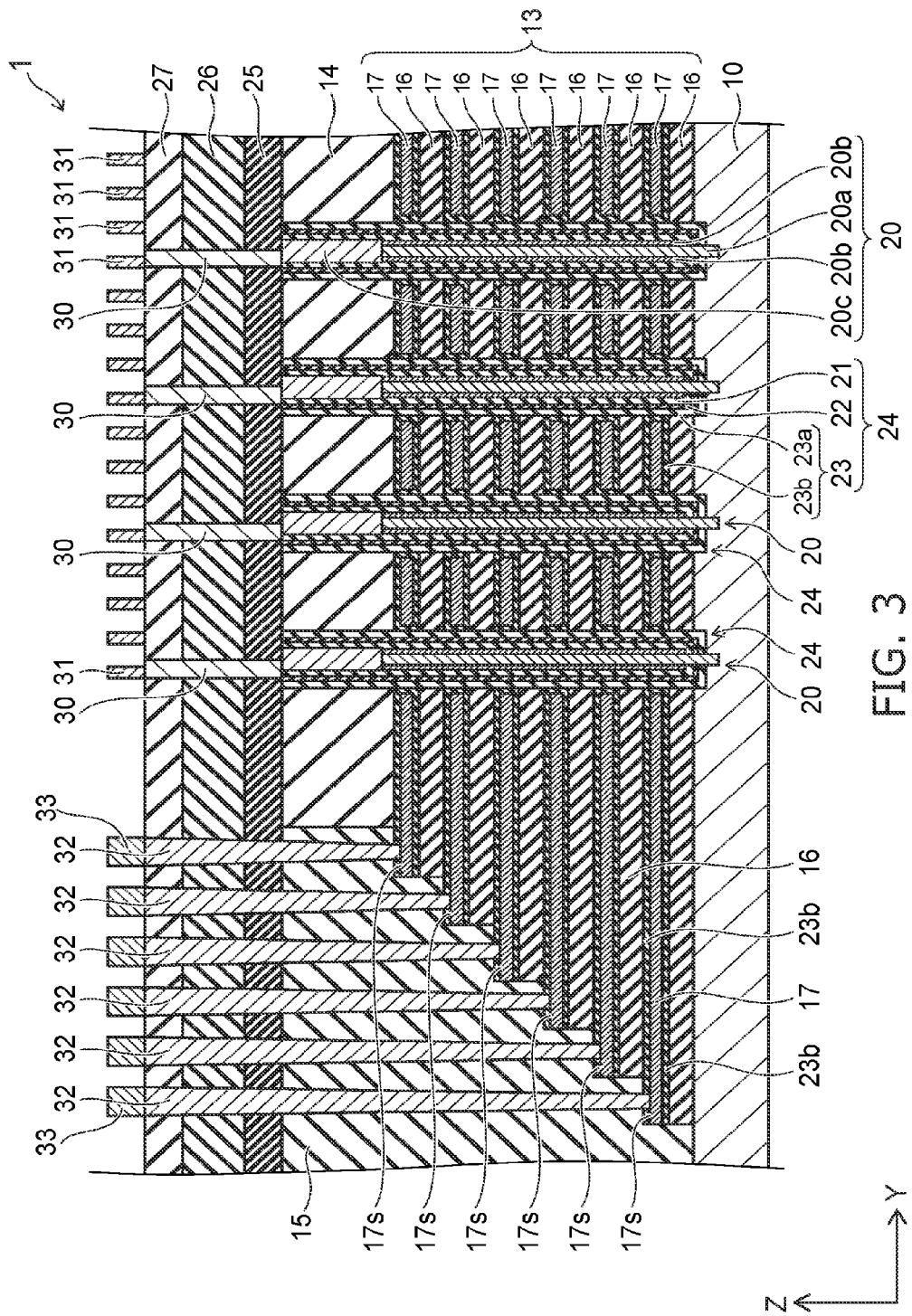
FIG. 3 and FIG. 4 are cross-sectional views showing the semiconductor memory device according to the first embodiment.
Figure 4:
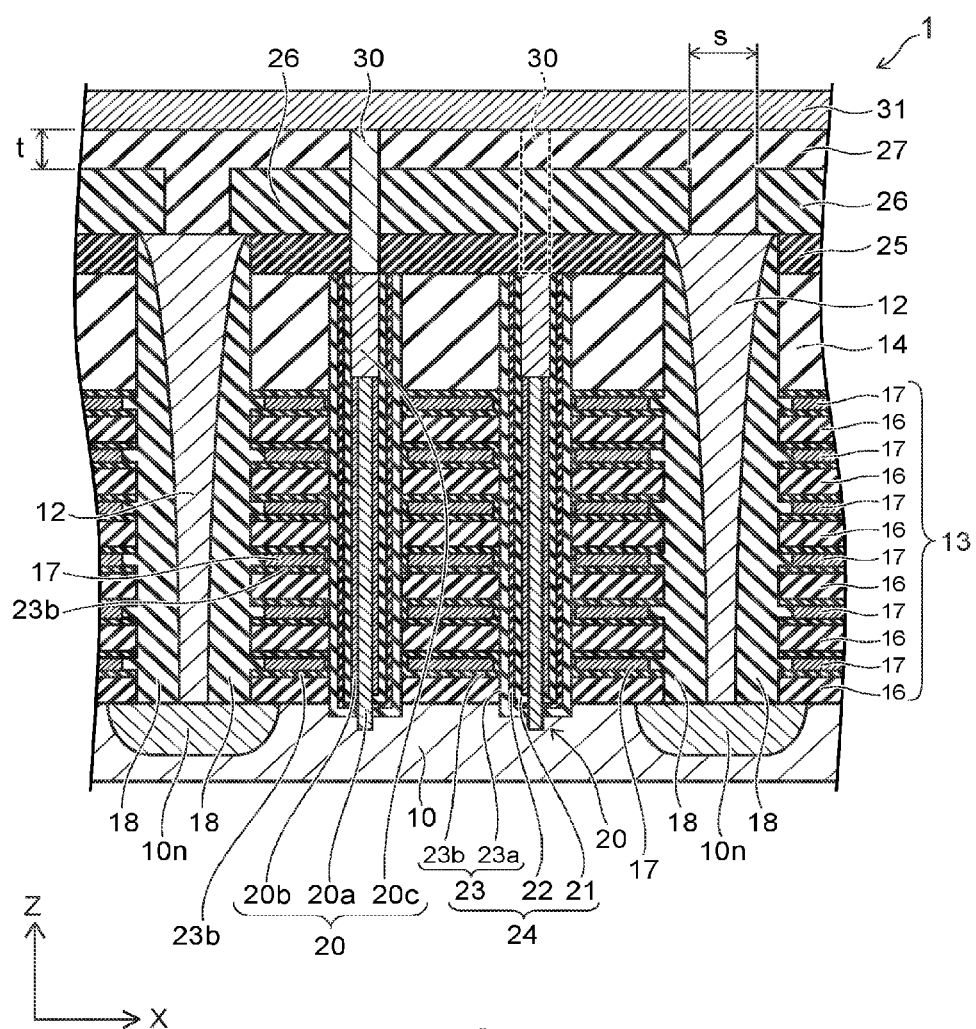

FIG. 3 and FIG. 4 are cross-sectional views showing the semiconductor memory device according to the embodiment.

An internal stress film that is described below is not shown in FIG. 1. Also, FIG. 3 and FIG. 4 show mutually-orthogonal cross sections.

As shown in FIG. 1 to FIG. 4, a silicon substrate 10 is provided in the semiconductor memory device 1 according to the embodiment. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface of the silicon substrate 10 is taken as a "Z-direction."

Source electrodes 12 that have band configurations extending in the Y-direction are multiply provided as conductive members on the silicon substrate 10. The multiple source electrodes 12 are arranged to be separated from each other along the X-direction at uniform spacing. In the specification, "a member extends in a direction" means that the length of the member in the direction is long compared to the length of the member in another direction. For each of the source electrodes 12, the length in the Y-direction is the longest; the length (the width) in the Z-direction is the next longest; and the length (the thickness) in the X-direction is the shortest. Also, the thickness, i.e., the length in the X-direction, of the source electrode 12 is smallest at the lower end portion, increases upward, and is largest at the upper end portion.

A main body unit made of tungsten (W) or molybdenum (Mo) and, for example, a barrier metal layer (not shown) that is made from titanium nitride (TiN) and covers a surface of the main body unit is provided in each of the source electrodes 12. Tungsten and molybdenum have internal stress in the tensile direction. Therefore, the source electrodes 12 try to contract along the Y-direction. The lower ends of the source electrodes 12 contact the silicon substrate 10. An n$^+$-type region 10n that contains an impurity that forms donors is formed in the portion of the silicon substrate 10 including the regions contacted by the source electrodes 12.

A stacked body 13, an insulating film 14, and an insulating film 25 are provided in this order upward from below in each region between two source electrodes 12 adjacent to each other in the X-direction. In the stacked body 13, multiple insulating films 16 and multiple electrode films 17 are stacked along the Z-direction alternately one layer at a time. For example, the insulating film 14, the insulating films 16, and the insulating film 25 are formed of silicon oxide (SiO$_2$). For example, a main body unit made of tungsten or molybdenum and, for example, a barrier metal layer that is made from titanium nitride and covers a surface of the main body unit are provided in the electrode film 17. The stacked body 13, the insulating film 14, and the insulating film 25 are partitioned by the source electrodes 12 and extend in the Y-direction. Accordingly, the insulating films 16 and the electrode films 17 also extend in the Y-direction.

A sidewall 18 that is insulative is provided between the source electrode 12 and the structure body made of the stacked body 13, the insulating film 14, and the insulating film 25. The electrode films 17 are insulated from the source electrode 12 by the sidewall 18. The sidewall 18 also extends in the Y-direction; the thickness, i.e., the length in the X-direction, of the lower end portion is the thickest; the thickness decreases upward; and the thickness of the upper end portion is the thinnest. For example, the sidewall 18 is formed of silicon oxide.

A memory cell region Rm and a contact region Rc are set in the semiconductor memory device 1. The memory cell region Rm and the contact region Rc are arranged along the Y-direction. Multiple silicon pillars 20 that extend in the Z-direction are provided in the memory cell region Rm. The silicon pillars 20 pierce the insulating film 14 and the stacked body 13; and the lower ends of the silicon pillars 20 are connected to the silicon substrate 10. When viewed from the Z-direction, for example, the silicon pillars 20 are arranged in a staggered configuration. In the example shown in FIG. 1, two columns of the silicon pillars 20 are arranged to zigzag along the Y-direction in each of the stacked bodies 13.

Each of the silicon pillars 20 includes: a core portion 20$a$ that has a circular columnar configuration, is positioned inside the stacked body 13, and is included in the central portion of the silicon pillar 20; a cover layer 20$b$ that has a cylindrical configuration and is provided around the core portion 20$a$; and a plug portion 20$c$ that is positioned inside the insulating film 14 and provided above the core portion 20$a$ and the cover layer 20$b$. The entire silicon pillar 20 is formed of polysilicon. The configuration of the core portion 20$a$ may be a circular tube; and an insulating member may be provided in the interior of the circular tube.

A tunneling insulating film 21 is provided around the silicon pillar 20, i.e., on the side surface of the silicon pillar 20. Although the tunneling insulating film 21 normally is insulative, the tunneling insulating film 21 is a film in which a tunneling current flows when a prescribed voltage within the range of the drive voltage of the semiconductor memory device 1 is applied and is, for example, a single-layer silicon oxide film, or an ONO film in which a silicon oxide layer, a silicon nitride layer, and a silicon oxide layer are stacked. A charge storage film 22 is provided around the tunneling insulating film 21. The charge storage film 22 is a film that can store charge, is formed of, for example, a material having trap sites of electrons, and is formed of, for example, silicon nitride (Si$_3$N$_4$).

A silicon oxide layer 23$a$ that is made of silicon oxide is provided around the charge storage film 22. An aluminum oxide layer 23$b$ that is made of aluminum oxide (Al$_2$O$_3$) is provided between the silicon oxide layer 23$a$ and the electrode films 17 and between the insulating films 16 and the electrode films 17. A blocking insulating film 23 includes the silicon oxide layer 23$a$ and the aluminum oxide layer 23$b$. The blocking insulating film 23 is a film that substantially does not allow a current to flow even when a voltage within the range of the drive voltage of the semiconductor memory device 1 is applied. A memory film 24 that is capable of storing charge includes the tunneling insulating film 21, the charge storage film 22, and the blocking insulating film 23. Accordingly, the memory film 24 is disposed between the silicon pillar 20 and the electrode films 17.

Multiple internal stress films 26 are provided on the insulating film 25. The internal stress films 26 are not provided in the regions directly above the X-direction central portions of the source electrodes 12 but are provided in the regions directly above the two X-direction end portions of the source electrodes 12 and the regions directly above the stacked bodies 13. Therefore, the multiple internal stress films 26 extend in the Y-direction and are separated from each other in the X-direction. The internal stress films 26 are made of a material that has compressive stress; and the internal stress films 26 try to elongate along the Y-direction. Also, the internal stress films 26 are insulative. For example, the internal stress films 26 are made of silicon nitride formed by plasma CVD (Chemical Vapor Deposition). An insulating film 27 is provided on the internal stress films 26. The insulating film 27 is disposed also between the internal stress films 26. For example, the insulating film 27 is formed of silicon oxide. A thickness t of the insulating film 27 is not less than half of a distance s between the internal stress films 26 in the X-direction. In other words, t≥(s/2).

A plug 30 that extends in the Z-direction and pierces an inter-layer insulating film 15, the insulating film 25, the internal stress film 26, and the insulating film 27 is provided in the region directly above the silicon pillar 20. For example, the plug 30 is formed of a conductive material such as tungsten, etc. Bit lines 31 that extend in the X-direction are provided on the insulating film 27. Each of the bit lines 31 is connected to one silicon pillar 20 via one plug 30 for each of the stacked bodies 13.

On the other hand, in the contact region Rc, the configuration of the Y-direction end portion of the stacked body 13 is a stairstep configuration; and a step 17$s$ is formed for each of the electrode films 17. The inter-layer insulating film 15 covers the end portion of the stacked body 13 having the stairstep configuration. The thickness of the inter-layer insulating film 15 is substantially equal to the total thickness of the stacked body 13 and the insulating film 14; the upper surface of the inter-layer insulating film 15 is flat; and the upper surface of the inter-layer insulating film 15 and the upper surface of the insulating film 14 are included in substantially the same plane. The insulating film 25, the internal stress films 26, and the insulating film 27 are provided on the inter-layer insulating film 15.

A silicon pillar 20$s$ that extends in the Z-direction is provided inside the inter-layer insulating film 15 and at the end portion of the stacked body 13 having the stairstep configuration. As described below, the silicon pillar 20$s$ is not included in memory cells and is a post that supports the insulating films 16 so that the insulating films 16 do not deflect and contact each other partway through the processes. The basic configuration of the silicon pillar 20$s$ is similar to that of the silicon pillar 20 provided in the memory cell region Rm described above. In other words, the core portion 20$a$, the cover layer 20$b$, and the plug portion 20$c$ are provided. Also, the memory film 24 is provided around the silicon pillar 20$s$. It is favorable for the diameter of the silicon pillar 20$s$ to be larger than the diameter of the silicon pillar 20 to increase the strength. In such a case, the configuration of the core portion 20$a$ of the silicon pillar 20$s$ may be a circular tube; and an insulating member may be provided in the interior of the circular tube.

A contact 32 is provided on each of the steps 17s of each of the stacked bodies 13. The contact 32 extends in the Z-direction and pierces the aluminum oxide layer 23b, the inter-layer insulating film 15, the insulating film 25, the internal stress film 26, and the insulating film 27. The lower end of the contact 32 is connected to the electrode film 17. Multiple upper layer word lines 33 that extend in the Y-direction are provided on the insulating film 27. The upper ends of the contacts 32 are connected to the upper layer word lines 33. Therefore, the electrode films 17 are connected to the upper layer word lines 33 via the contacts 32.

In the memory cell region Rm, the silicon pillars 20 are connected between the silicon substrate 10 and the bit lines 31. Also, memory cells that include the memory film 24 are formed at each intersection between the silicon pillars 20 and the electrode films 17. In the memory cell region Rm, many memory cells are arranged in a three-dimensional matrix configuration along the X-direction, the Y-direction, and the Z-direction; and data can be stored in the memory cells.

In the contact region Rc, the electrode films 17 are drawn out from the memory cell region Rm and connected to a peripheral circuit (not shown) via the contacts 32 and the upper layer word lines 33.

A method for manufacturing the semiconductor memory device according to the embodiment will now be described.

FIG. 5 to FIG. 13 are cross-sectional views showing the method for manufacturing the semiconductor memory device according to the embodiment.

The cross sections shown in FIG. 5 to FIG. 13 correspond to the cross section shown in FIG. 4.

Figure 5:
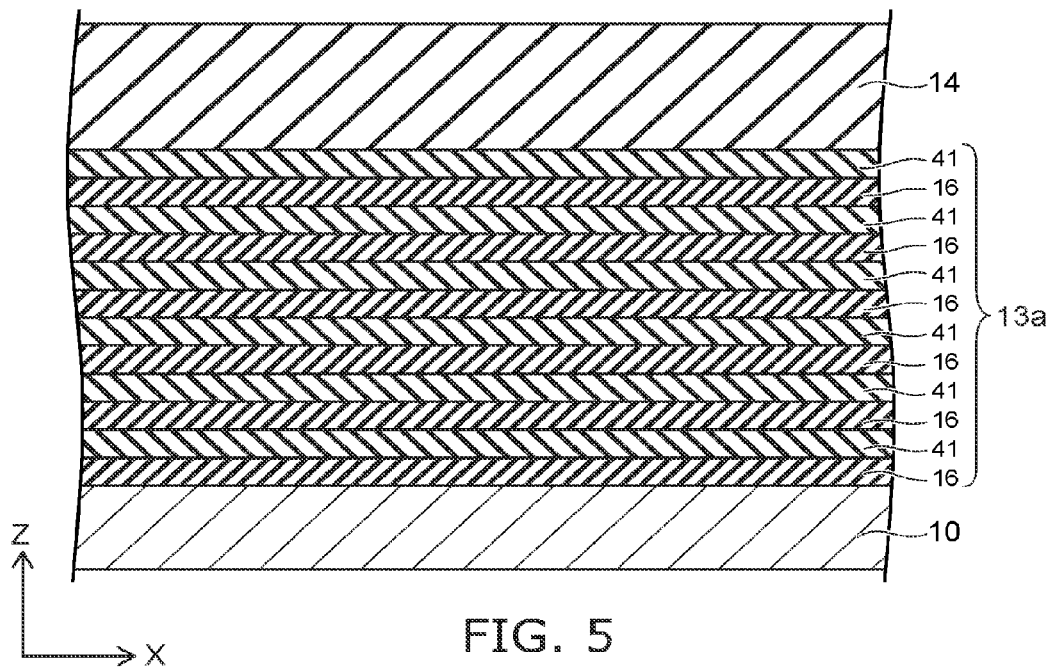
FIG. 5 to FIG. 13 are cross-sectional views showing a method for manufacturing a semiconductor memory device according to the first embodiment.

First, the silicon substrate 10 is prepared as shown in FIG. 5. The silicon substrate 10 is, for example, a portion of a silicon wafer. Then, for example, a stacked body 13a is formed on the silicon substrate 10 by stacking the insulating films 16 and sacrificial films 41 alternately along the Z-direction by CVD. For example, the insulating films 16 are formed of silicon oxide. The sacrificial films 41 are formed of a material that has etching selectivity with respect to the insulating films 16 and are, for example, formed of silicon nitride. Then, for example, the insulating film 14 is formed by depositing silicon oxide on the stacked body 13a.

Figure 8:
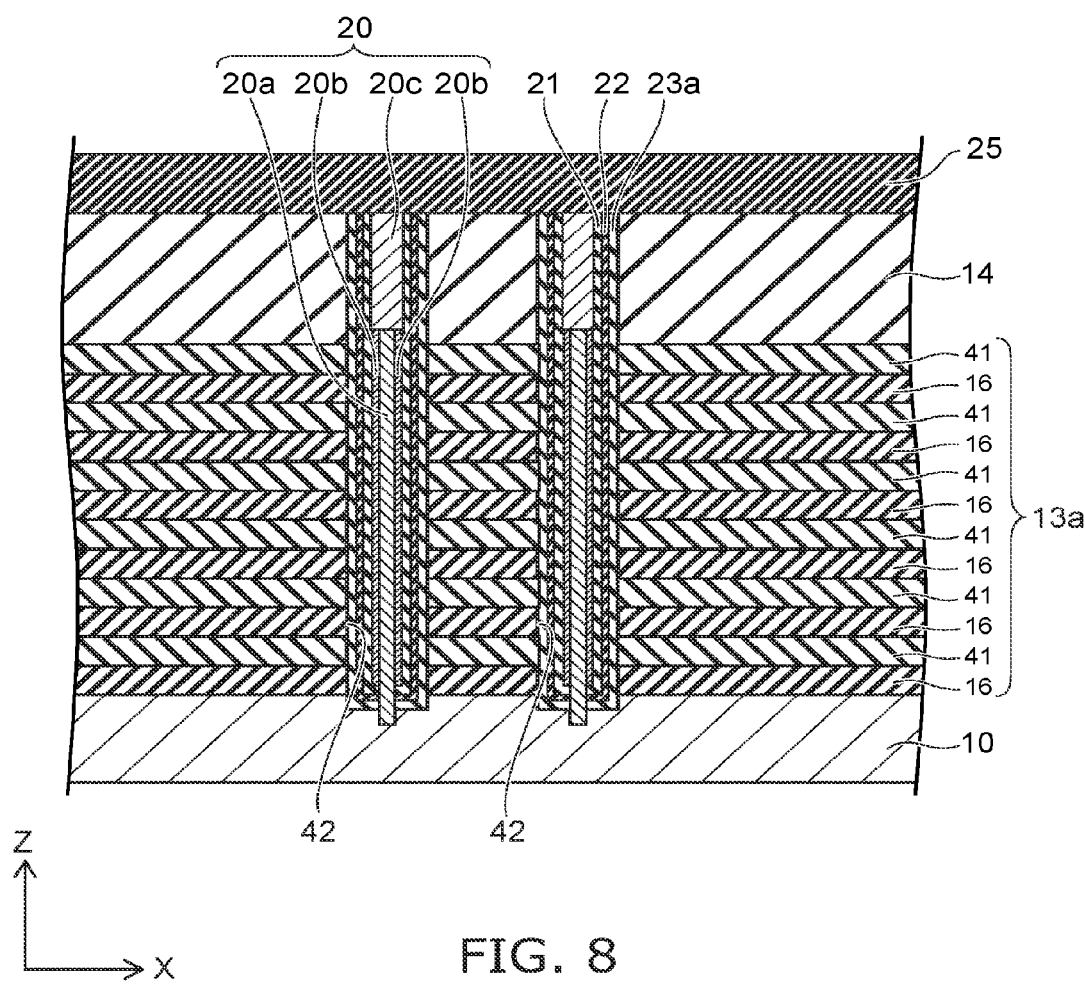

Then, in the contact region Rc as shown in FIG. 3, the stacked body 13a is patterned into a stairstep configuration; and a step is formed for each of the sacrificial films 41. Then, as shown in FIG. 3 and FIG. 8, for example, the inter-layer insulating film 15 is formed on the silicon substrate 10 to cover the stacked body 13a and the insulating film 14 by depositing silicon oxide. At this time, the inter-layer insulating film 15 is formed to be sufficiently thick so that the stairstep configuration of the stacked body 13a is not reflected on the upper surface of the inter-layer insulating film 15. Then, by performing planarization such as CMP (Chemical Mechanical Polishing), etc., of the upper surface of the inter-layer insulating film 15, the inter-layer insulating film 15 that is deposited on the insulating film 14 is removed; and the upper surface of the insulating film 14 and the upper surface of the inter-layer insulating film 15 form a continuous plane.

Figure 6:
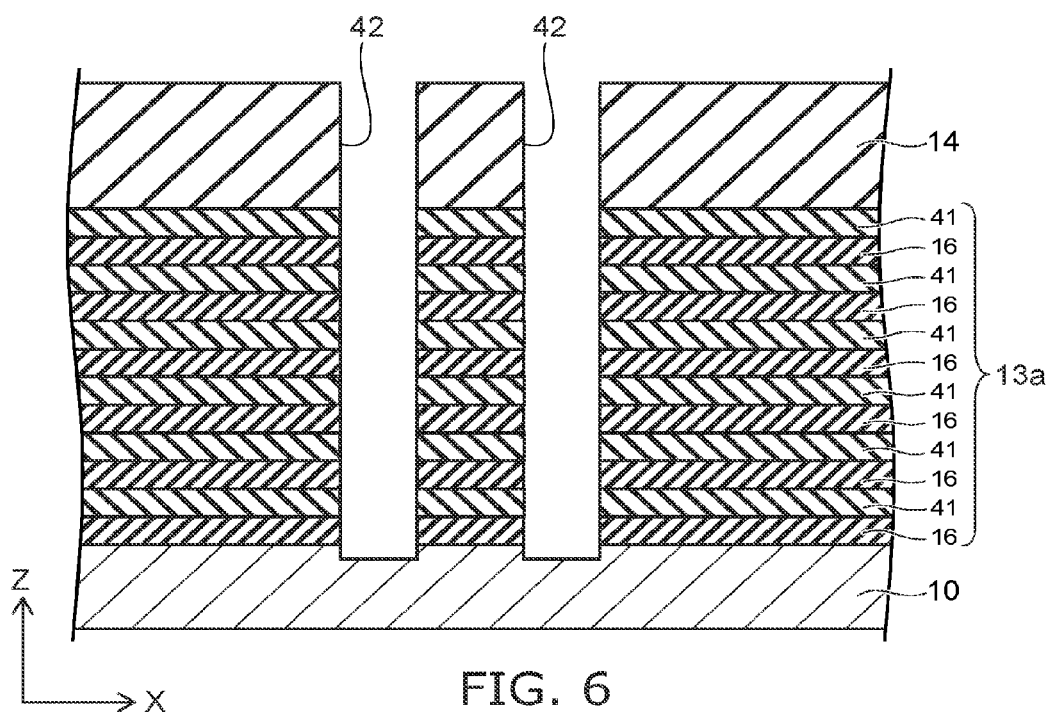

Then, as shown in FIG. 6, multiple memory holes 42 that extend in the Z-direction are made by, for example, RIE (Reactive Ion Etching) in both the memory cell region Rm and the contact region Rc. Only the memory cell region Rm is shown in FIG. 6. The configurations of the memory holes 42 are circles as viewed from the Z-direction. However, the diameter of the memory holes 42 made in the contact region Rc is larger than that of the memory holes 42 made in the memory cell region Rm. In the memory cell region Rm, the memory holes 42 pierce the insulating film 14 and the stacked body 13a and reach the silicon substrate 10. Also, when viewed from the Z-direction, for example, the memory holes 42 are arranged in a staggered configuration. In the contact region Rc, the memory holes 42 pierce the inter-layer insulating film 15 and the stacked body 13a and reach the silicon substrate 10.

Figure 7:
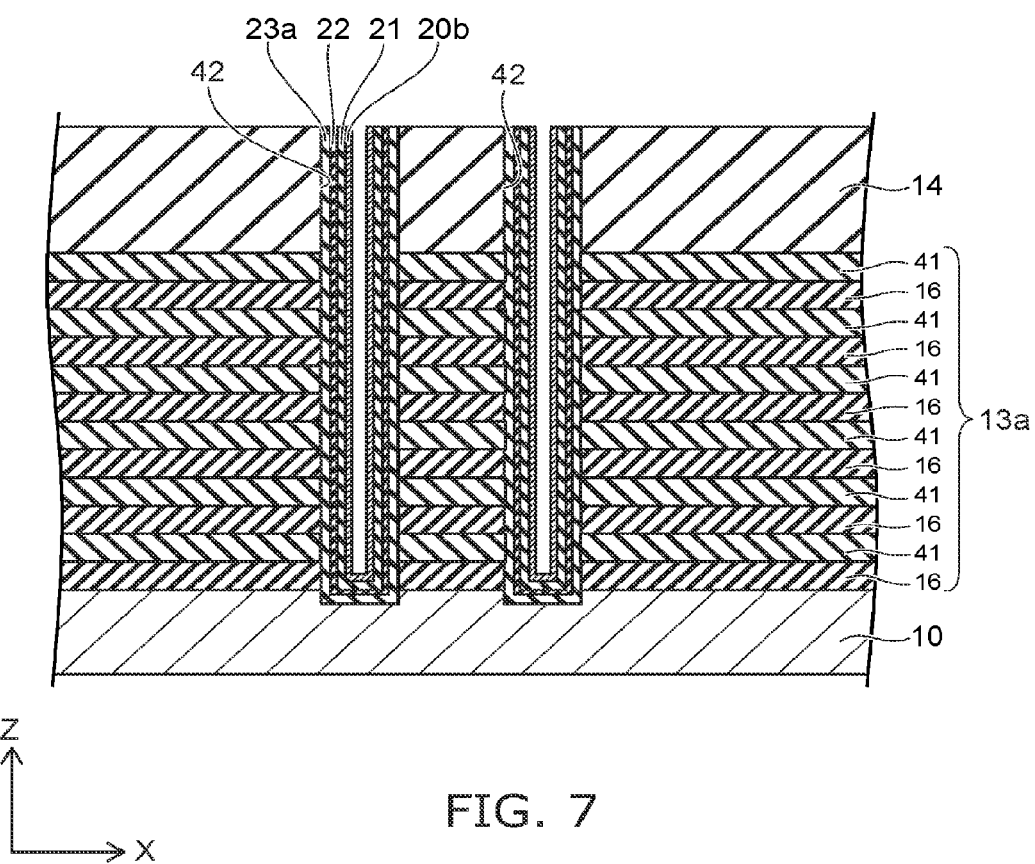

Then, as shown in FIG. 7, the silicon oxide layer 23a is formed by depositing silicon oxide on the inner surfaces of the memory holes 42 by, for example, CVD; then, the charge storage film 22 is formed by depositing silicon nitride; then, the tunneling insulating film 21 is formed by depositing, for example, silicon oxide; and then, the cover layer 20b is formed by depositing silicon.

Then, as shown in FIG. 8, the silicon substrate 10 is exposed by removing the cover layer 20b, the tunneling insulating film 21, the charge storage film 22, and the silicon oxide layer 23a that are on the bottom surfaces of the memory holes 42 by performing RIE. Then, the core portion 20a is formed by depositing silicon. The core portion 20a reaches the silicon substrate 10 and is connected to the silicon substrate 10. In the contact region Rc, an insulating member may be further filled into the interior of the circular tube core portion 20a by depositing silicon oxide. Then, the upper portions of the cover layer 20b and the core portion 20a are removed by performing etch-back; and the plug portion 20c is formed by filling silicon having an impurity introduced. Thereby, the silicon pillars 20 are formed inside the memory holes 42 in the memory cell region Rm. Also, the silicon pillars 20s are formed inside the memory holes 42 in the contact region Rc. Then, the insulating film 25 is formed by depositing silicon oxide on the entire surface.

Figure 9:
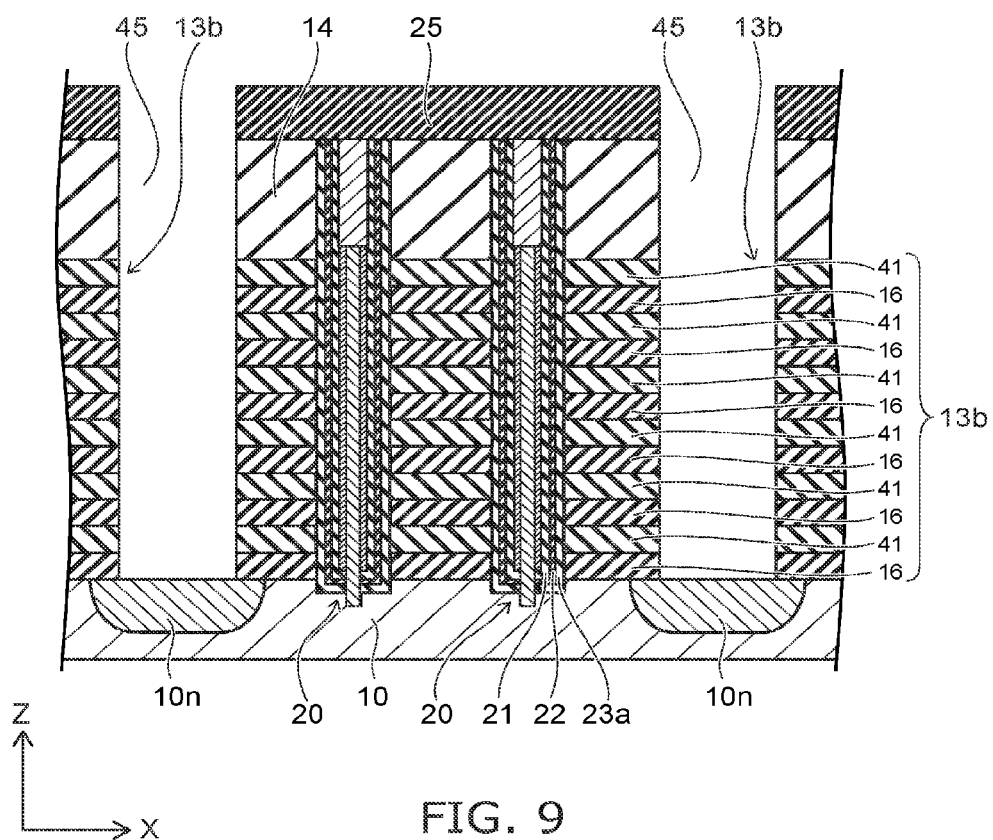

Then, as shown in FIG. 9, multiple slits 45 that extend in the Y-direction are made in the insulating film 25, the inter-layer insulating film 15, the insulating film 14, and the stacked body 13a by, for example, anisotropic etching such as RIE, etc. The slits 45 pierce the stacked body 13a. Thereby, the stacked body 13a is divided by the slits 45 into multiple stacked bodies 13b that extend in the Y-direction. Then, ion implantation of an impurity, e.g., phosphorus (P), that forms donors for silicon is performed via the slits 45. Thereby, the $n^+$-type region $10n$ is formed in the portion of the silicon substrate 10 including the regions directly under the slits 45.

Figure 10:
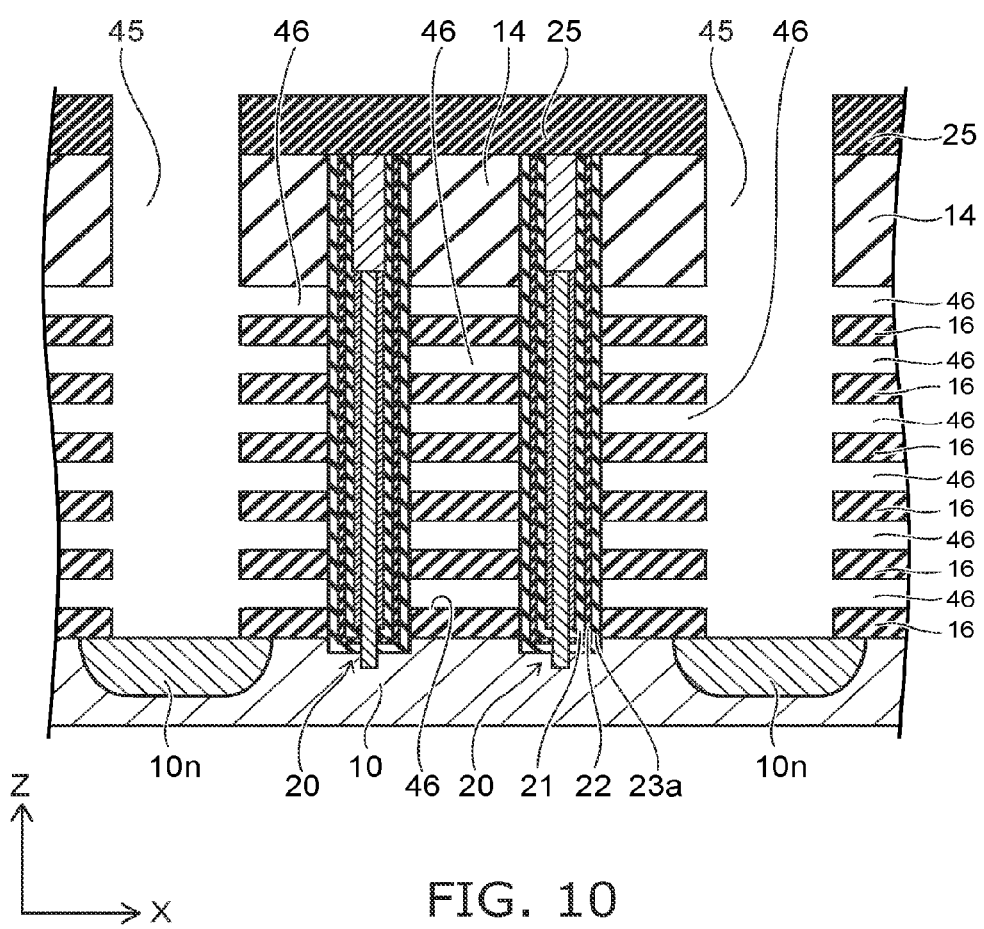

Then, as shown in FIG. 10, the sacrificial films 41 (referring to FIG. 9) are removed by performing wet etching via the slits 45. For example, in the case where the sacrificial films 41 are formed of silicon nitride, the etchant of the wet etching includes hot phosphoric acid. Thereby, spaces 46 are made between the insulating films 16 adjacent to each other in the Z-direction. At this time, the silicon pillars 20 and 20s support the insulating films 16. Thereby, the deflection of the insulating films 16, mashing of the spaces 46, and contact between the insulating films 16 can be prevented.

Figure 11:
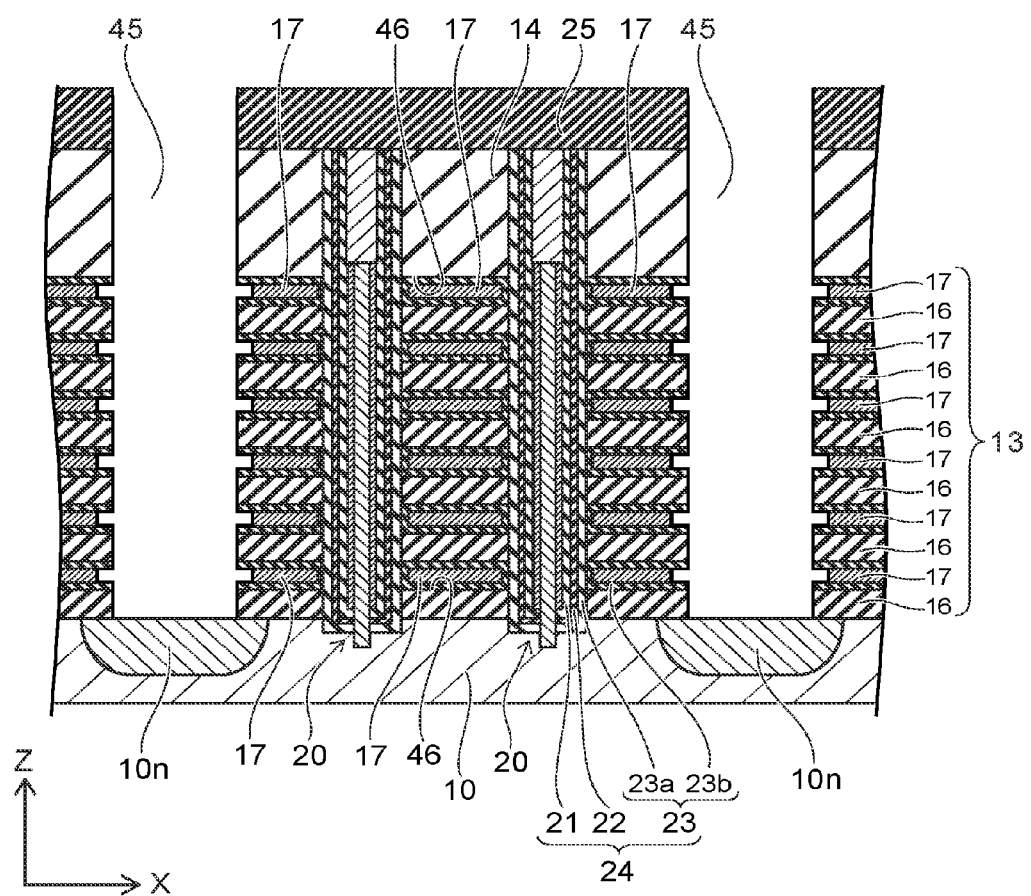

Then, as shown in FIG. 11, the aluminum oxide layer 23b is formed via the slits 45 on the side surfaces of the slits 45 and on the inner surfaces of the spaces 46. Then, a barrier metal layer (not shown) is formed by thinly depositing titanium nitride by, for example, CVD via the slits 45; and subsequently, the electrode films 17 are formed inside the spaces 46 and on the side surfaces of the slits 45 by filling the spaces 46 by depositing tungsten or molybdenum. Then, the electrode films 17 and the aluminum oxide layer 23b are divided for each of the spaces 46 by performing etch-back of the electrode films 17 and the aluminum oxide layer 23b to remove the electrode films 17 and the aluminum oxide layer 23b that are on the side surfaces of the slits 45 and cause the electrode films 17 and the aluminum oxide layer 23b to remain inside the spaces 46.

Thus, the sacrificial films 41 are replaced with the electrode films 17; and the stacked bodies 13 are formed between the slits 45. The blocking insulating film 23 is formed of the silicon oxide layer 23a and the aluminum oxide layer 23b. Also, the memory film 24 is formed of the blocking insulating film 23, the charge storage film 22, and the tunneling insulating film 21.

Figure 12:
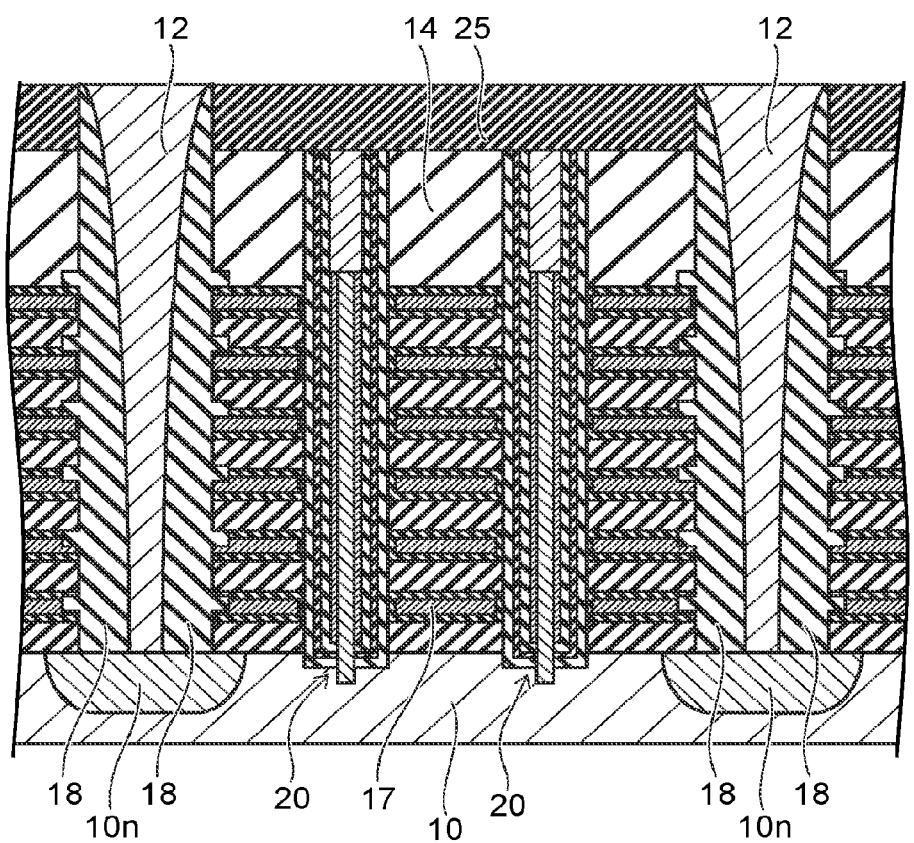

Then, as shown in FIG. 12, after forming an insulating film by depositing silicon oxide on the entire surface, the insulative sidewalls 18 are formed by performing etch-back of the insulating film and by causing the sidewalls 18 to remain on the side surfaces of the slits 45.

Then, a barrier metal layer (not shown) is formed by thinly depositing titanium nitride; and a conductive film is formed by thickly depositing tungsten or molybdenum. Then, the portions of the conductive film and the barrier metal layer that are deposited on the insulating film 25 are removed by performing CMP or etch-back by dry etching such as RIE, etc. Thereby, the source electrodes 12 are formed inside the slits 45. The lower ends of the source electrodes 12 contact the n$^+$-type region 10n of the silicon substrate 10.

Figure 13:
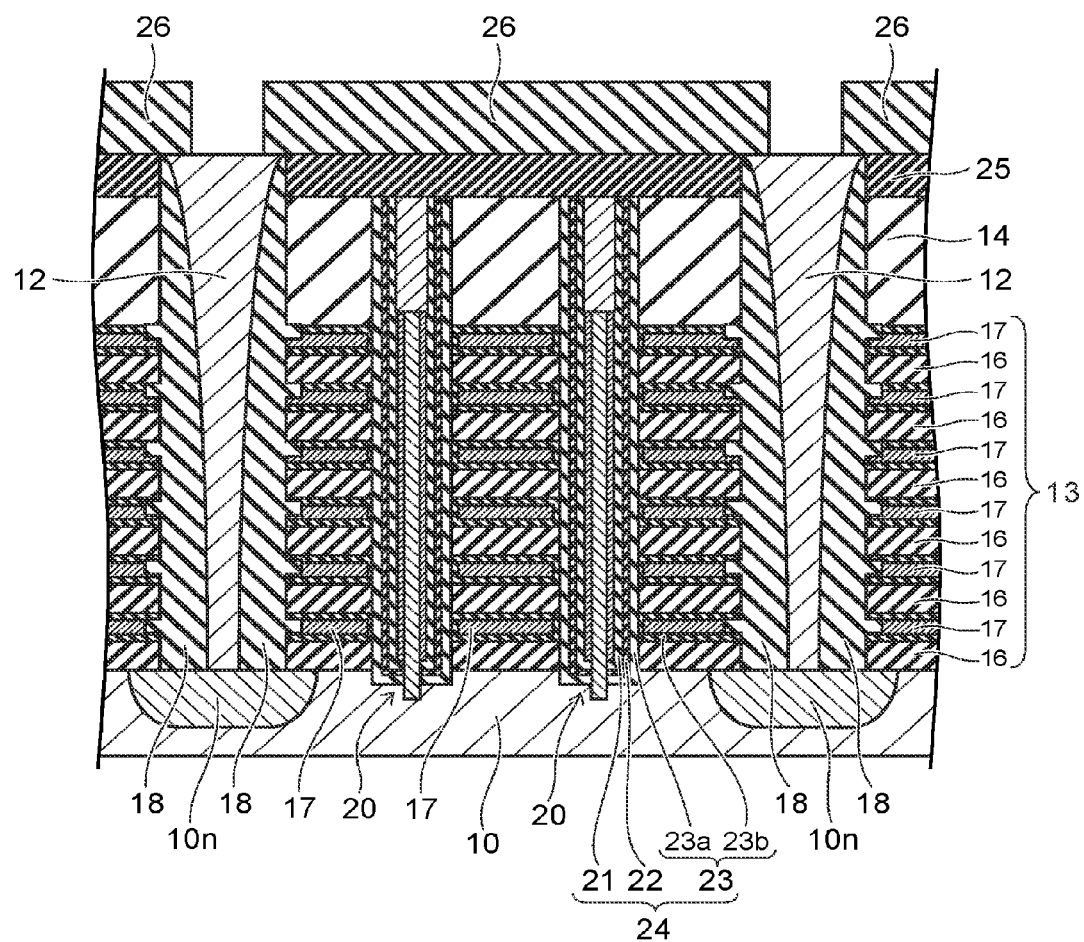

Then, as shown in FIG. 13 and FIG. 2, for example, silicon nitride is deposited by plasma CVD. Thereby, the internal stress films 26 that have internal stress in the compressive direction are formed. Then, the portions of the internal stress films 26 disposed in the regions directly above the X-direction central portions of the source electrodes 12 are removed. Thereby, the internal stress films 26 are divided into portions having rectangular configurations extending in the Y-direction for each of the stacked bodies 13. The divided internal stress films 26 try to elongate in the Y-direction due to the internal stress.

Then, as shown in FIG. 3 and FIG. 4, the insulating film 27 that has a flat surface is formed by depositing silicon oxide on the insulating film 25 and the internal stress films 26 and by performing CMP.

Then, plug holes are made in the regions directly above the silicon pillars 20 in the memory cell region Rm and contact holes are made in the regions directly above the steps 17s of the electrode films 17 in the contact region Rc by selectively removing the insulating film 27, the internal stress films 26, the insulating film 25, the inter-layer insulating film 15, and the aluminum oxide layer 23b by lithography and RIE. Then, the plugs 30 are formed inside the plug holes and the contacts 32 are formed inside the contact holes by filling a conductive material such as tungsten, etc., into the plug holes and the contact holes.

Then, a conductive film is formed on the insulating film 27; and by patterning using RIE, etc., the bit lines 31 that extend in the X-direction are formed in the memory cell region Rm; and the upper layer word lines 33 are formed in the contact region Rc. The bit lines 31 are connected to the silicon pillars 20 via the plugs 30. The upper layer word lines 33 are connected to the electrode films 17 via the contacts 32.

Although the bit lines 31 and the upper layer word lines 33 are formed by RIE patterning in the embodiment, this is not limited thereto. For example, these interconnects may be formed by a damascene process. In other words, the interconnects may be formed by further forming an insulating film on the insulating film 27, making trenches in the insulating film, forming a conductive film to fill the trenches, and performing CMP to remove the conductive film that is on the insulating film and cause the conductive film to remain only inside the trenches.

Subsequently, the silicon wafer is cut into the multiple semiconductor memory devices 1 by dicing. Thus, the semiconductor memory device 1 according to the embodiment is manufactured.

Figure 14A:
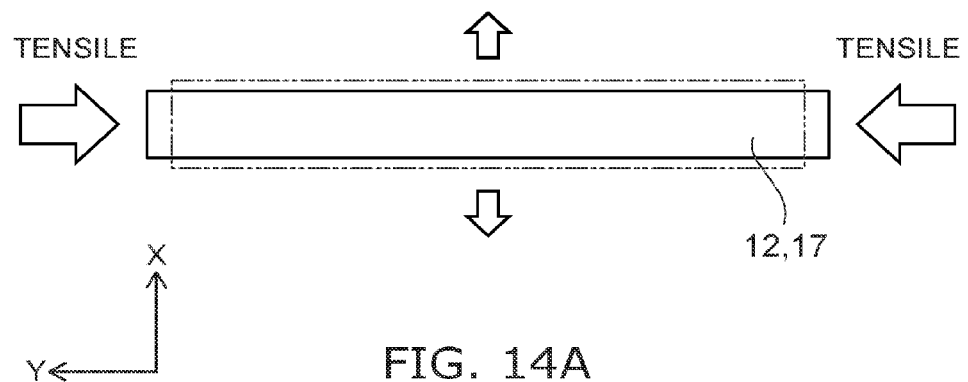
FIG. 14A is a figure showing the direction of an internal stress of a source electrode and an electrode film.
Figure 14B:
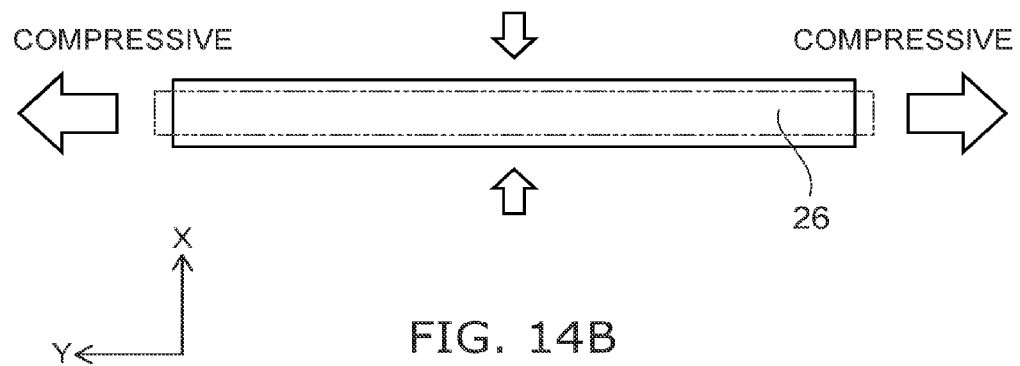
FIG. 14B is a figure showing the internal stress of an internal stress film.

Effects of the embodiment will now be described. FIG. 14A is a figure showing the direction of the internal stress of the source electrode and the electrode film; and FIG. 14B is a figure showing the internal stress of the internal stress film.

In the semiconductor memory device 1 according to the embodiment as shown in FIG. 2 and FIG. 4, the source electrode 12 and the electrode film 17 that extend in the Y-direction and are made of tungsten or molybdenum are provided; and the internal stress film 26 that extends in the Y-direction and is made of silicon nitride is provided.

Tungsten and molybdenum have internal stress in the tensile direction. Therefore, as shown in FIG. 14A, the source electrode 12 and the electrode film 17 that extend in the Y-direction and include tungsten or molybdenum try to contract along the Y-direction. On the other hand, the source electrode 12 and the electrode film 17 try to elongate slightly along the X-direction.

On the other hand, silicon nitride can be provided with internal stress in the compressive direction by the formation conditions, e.g., the deposition conditions of the plasma CVD. Therefore, as shown in FIG. 14B, the internal stress film 26 that extends in the Y-direction and includes silicon nitride tries to elongate along the Y-direction. On the other hand, the internal stress film 26 tries to contract slightly along the X-direction. Thus, the polarity of the internal stress of the internal stress film 26 is the reverse of the polarity of the internal stress of the source electrode 12 and the electrode film 17.

Therefore, in the semiconductor memory device 1, the tensile stress of the source electrode 12 and the electrode film 17 and the compressive stress of the internal stress film 26 cancel each other; and the internal stress of the entire semiconductor memory device 1 can be reduced in both the Y-direction and the X-direction. Thereby, in the state prior to the dicing, the warp of the wafer can be suppressed. As a result, in the lithography processes, it is easier to align the focal point; and the precision of the lithography increases. Accordingly, the shape precision of the semiconductor memory device 1 increases. Also, the handling of the wafer in the manufacturing processes is easier. For example, when performing suction of the wafer to a holder by a vacuum chuck, air does not leak easily via gaps between the holder and the wafer; and the wafer is held easily and reliably. As a result, the precision of each processing increases; and the productivity increases.

On the other hand, if the internal stress film 26 is not provided in the semiconductor memory device 1, the wafer warps to protrude downward in the Y-direction and warps to protrude upward in the X-direction due to the tensile stress of the source electrode 12 and the electrode film 17. As a result, the configuration of the wafer is a saddle configuration. Thereby, it is difficult to align the focal point in the lithography processes; and the precision decreases. Also, for example, the handling of the wafer in the manufacturing processes is difficult, that is, the wafer is difficult to fix to the holder by the vacuum chuck, etc. Therefore, the productivity decreases.

It also may be considered to form an internal stress film having compressive stress on the entire surface of the upper surface of the wafer or to form an internal stress film having tensile stress on the entire surface of the lower surface of the wafer. However, in such a case, the anisotropy of the internal stress of the source electrode 12 and the electrode film 17 cannot be eliminated; and it is difficult to effectively suppress the deformation of the wafer.

Thus, according to the embodiment, a semiconductor memory device and a method for manufacturing the semiconductor memory device that provide high shape precision and productivity can be realized.

(Second Embodiment)

A second embodiment will now be described.

Figure 15:
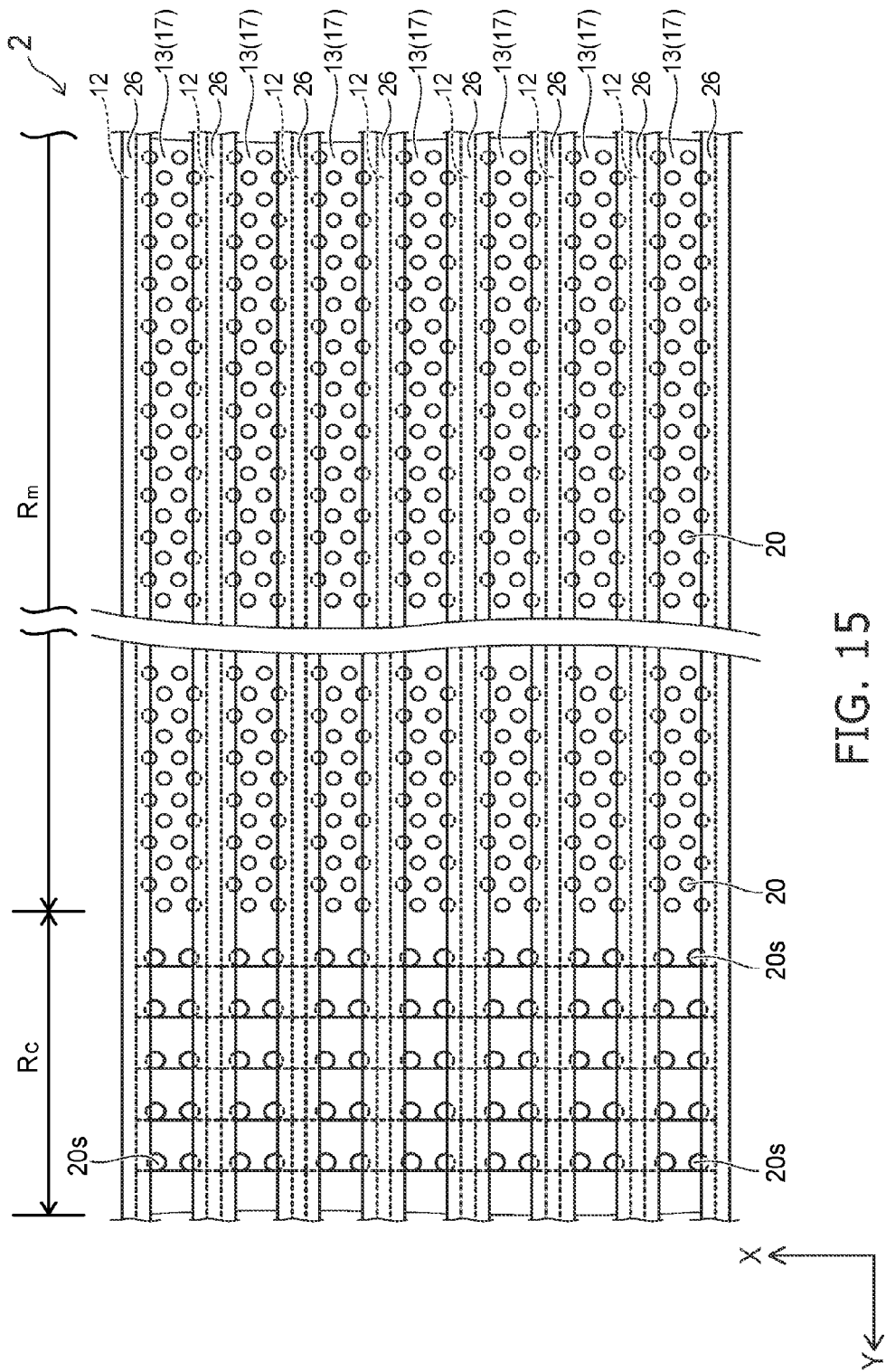
FIG. 15 is a plan view showing a semiconductor memory device according to a second embodiment.

FIG. 15 is a plan view showing a semiconductor memory device according to the embodiment.

In the semiconductor memory device 2 according to the embodiment as shown in FIG. 15, the internal stress films 26 are provided in the regions directly above the source electrodes 12 and the regions directly above the two X-direction end portions of the stacked bodies 13 but are not provided in the regions directly above the X-direction central portions of the stacked bodies 13.

Otherwise, the configuration, the manufacturing method, the operations, and the effects of the embodiment are similar to those of the first embodiment described above.

(Third Embodiment)

A third embodiment will now be described.

Figure 16:
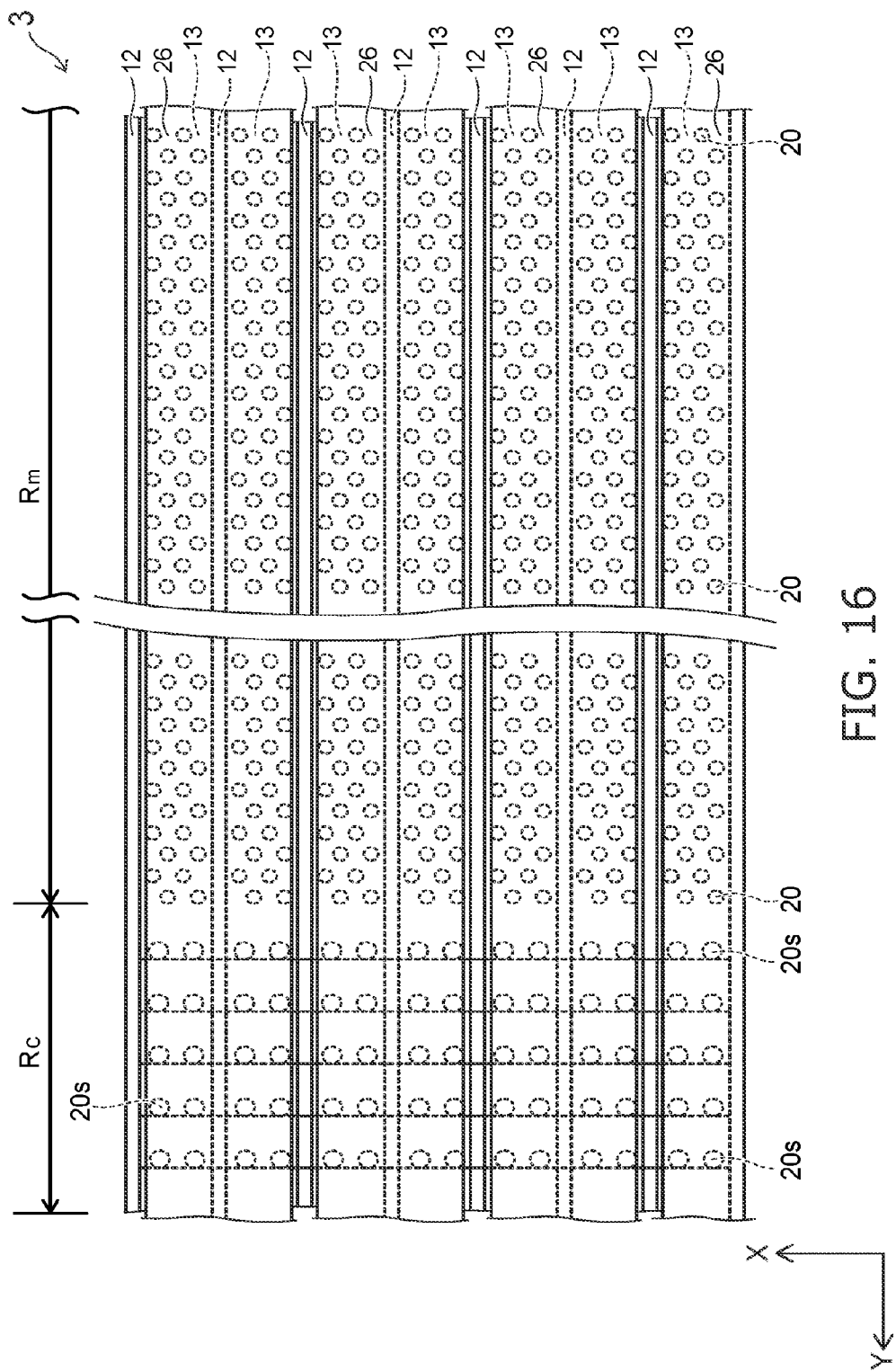
FIG. 16 is a plan view showing a semiconductor memory device according to the embodiment.

FIG. 16 is a plan view showing a semiconductor memory device according to the embodiment.

In the semiconductor memory device 3 according to the embodiment as shown in FIG. 16, the internal stress film 26 is provided every two stacked bodies 13 adjacent to each other in the X-direction. In other words, when the multiple stacked bodies 13 that are arranged in the X-direction are paired every two mutually-adjacent stacked bodies 13, the internal stress film 26 is provided in the region directly above the two stacked bodies 13 belonging to each pair and the source electrode 12 disposed between the two stacked bodies 13; and the internal stress film 26 is not provided in the region directly above the source electrode 12 disposed between the pairs.

Otherwise, the configuration, the manufacturing method, the operations, and the effects of the embodiment are similar to those of the first embodiment described above.

According to the embodiments described above, a semiconductor memory device and a method for manufacturing the semiconductor memory device that provide high shape precision and productivity can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a substrate;
a plurality of conductive members provided on the substrate, the plurality of conductive members extending in a first direction, being separated from each other in a second direction, and including a metal, the first direction being parallel to an upper surface of the substrate, the second direction intersecting the first direction and being parallel to the upper surface of the substrate;
a stacked body provided in each region between the conductive members, the stacked body including a plurality of insulating films and a plurality of electrode films, each of the plurality of insulating films and each of the plurality of electrode films being stacked along a third direction, the third direction intersecting the upper surface of the substrate;
a semiconductor pillar extending in the third direction and piercing the stacked body;
a memory film provided between the semiconductor pillar and one of the electrode films; and
a plurality of internal stress films extending in the first direction, being separated from each other in the second direction, and including a material having internal stress having the reverse polarity of internal stress of the metal, the internal stress films being disposed above the conductive members and above the stacked bodies.

2. The semiconductor memory device according to claim 1, further comprising:
a plug extending in the third direction and piercing one of the internal stress films, the plug being connected to the semiconductor pillar; and
an interconnect provided on the internal stress film and connected to the plug,
the internal stress film being insulative.

3. The semiconductor memory device according to claim 1, wherein the electrode films include the metal.

4. The semiconductor memory device according to claim 1, wherein
the metal is tungsten or molybdenum, and
the material is silicon nitride.

5. The semiconductor memory device according to claim 1, wherein
the internal stress films are silicon nitride films, and
the insulating films include silicon oxide.

6. The semiconductor memory device according to claim 1, wherein
the metal has tensile stress, and
the material has compressive stress.

7. The semiconductor memory device according to claim 1, wherein each of the internal stress films is provided above every stacked body.

8. The semiconductor memory device according to claim 1, wherein each of the internal stress films is provided above every two mutually-adjacent stacked bodies.

9. The semiconductor memory device according to claim 1, wherein the internal stress films are disposed in regions including regions directly above the conductive members.

10. A semiconductor memory device, comprising:
a substrate;
a plurality of conductive members provided on the substrate, the plurality of conductive members extending in a first direction, being separated from each other in a second direction, and including a metal, the first direction being parallel to an upper surface of the substrate, the second direction intersecting the first direction and being parallel to the upper surface of the substrate;
a stacked body provided in each region between the conductive members, the stacked body including a plurality of insulating films and a plurality of electrode films, each of the plurality of insulating films and each of the plurality of electrode films being stacked along a third direction, the third direction intersecting the upper surface of the substrate;
a semiconductor pillar extending in the third direction and piercing the stacked body;

a memory film provided between the semiconductor pillar and one of the electrode films; and a plurality of internal stress films extending in the first direction, being separated from each other in the second direction, and including a material having internal stress having the reverse polarity of internal stress of the metal, wherein the internal stress films are disposed in regions including regions directly above the stacked bodies.

11. A method for manufacturing a semiconductor memory device, comprising:

forming a stacked body on a substrate, the stacked body including first films, insulating films, a semiconductor pillar, and a second film, each of the first films and each of the insulating films being stacked alternately, the semiconductor pillar piercing the first films and the insulating films, the second film being provided between the semiconductor pillar and the first films;

making a plurality of slits in the stacked body, the plurality of slits extending in a first direction and being separated from each other in a second direction, the first direction being parallel to an upper surface of the substrate, the second direction intersecting the first direction and being parallel to the upper surface of the substrate;

making a space between the insulating films adjacent to each other in a third direction by removing the first film via the slit, the third direction intersecting the upper surface of the substrate;

forming a third film on an inner surface of the space via the slit, the second film and the third film forming a memory film on a side surface of the semiconductor pillar;

forming an electrode film inside the space via the slit;

forming a sidewall on a side surface of the slit, the sidewall being insulative;

forming a conductive member on a side surface of the sidewall, the conductive member including a metal; and forming internal stress films above the conductive member and above the stacked body, the internal stress films extending in the first direction, being separated from each other in the second direction, and including a material having internal stress having the reverse polarity of internal stress of the metal.

12. The method for manufacturing the semiconductor memory device according to claim 11, wherein the forming of the internal stress films includes depositing silicon nitride by plasma-enhanced chemical vapor deposition.

13. The method for manufacturing the semiconductor memory device according to claim 11, wherein the conductive member is formed of tungsten or molybdenum.

14. The method for manufacturing the semiconductor memory device according to claim 11, wherein the electrode film also is formed of the metal.

* * * * *